(12) United States Patent
Yamamoto et al.

(10) Patent No.: US 10,777,584 B2
(45) Date of Patent: Sep. 15, 2020

(54) DISPLAY DEVICE

(71) Applicant: Japan Display Inc., Minato-ku (JP)

(72) Inventors: Koji Yamamoto, Minato-ku (JP);
Hiroyuki Abe, Minato-ku (JP); Naoki Miyanaga, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/051,537

(22) Filed: Aug. 1, 2018

(65) Prior Publication Data
US 2019/0067333 A1 Feb. 28, 2019

(30) Foreign Application Priority Data
Aug. 23, 2017 (JP) .................. 2017-160452

(51) Int. Cl.
| H01L 27/12 | (2006.01) |
| H01L 27/24 | (2006.01) |
| H01L 27/32 | (2006.01) |
| H01L 51/52 | (2006.01) |
| G06F 3/041 | (2006.01) |
| G06F 3/044 | (2006.01) |

(52) U.S. Cl.
CPC ............ *H01L 27/124* (2013.01); *G06F 3/044* (2013.01); *G06F 3/0412* (2013.01); *H01L 27/2472* (2013.01); *H01L 27/3272* (2013.01); *H01L 27/3276* (2013.01); *H01L 51/5203* (2013.01); *H01L 27/322* (2013.01); *H01L 27/3211* (2013.01); *H01L 51/5253* (2013.01); *H01L 51/5284* (2013.01)

(58) Field of Classification Search
CPC ............ G02F 1/1368; G02F 1/134363; G02F 1/133512; G02F 2001/136218; G02F 1/136209; G02F 2201/50; G02F 1/133345; G02F 1/13452; G06F 2203/04107; G09G 3/3648; G09G 2300/0478; H01L 29/78633; H01L 27/3272; H01L 27/0207; H01L 27/3276; H01L 27/3288
See application file for complete search history.

(56) References Cited

U.S. PATENT DOCUMENTS

| 2006/0001927 A1* | 1/2006 | Murade ................. G02F 1/1345 358/518 |
| 2006/0267913 A1* | 11/2006 | Mochizuki ........... G09G 3/3688 345/100 |
| 2009/0231261 A1 | 9/2009 | Matsumoto et al. |
| 2013/0038806 A1* | 2/2013 | Tae ......................... G09G 3/006 349/43 |
| 2015/0268795 A1* | 9/2015 | Kurasawa ............. G06F 3/0418 345/174 |

(Continued)

Primary Examiner — Gerald Johnson
(74) Attorney, Agent, or Firm — Oblon, McClelland, Maier & Neustadt, L.L.P.

(57) ABSTRACT

A display device includes a signal line driver, provided in a peripheral area of a display panel, that outputs video signals, a signal selection circuit that distributes the video signals output from the signal line driver among signal lines connected to pixels, and a plurality of connection lines that make connection between the signal line driver and the signal selection circuit, and a shield layer made of the same material as second transparent electrodes that are pixel electrodes on a layer above the plurality of connection lines in an area excluding the signal selection circuit.

6 Claims, 18 Drawing Sheets

(56) References Cited

U.S. PATENT DOCUMENTS

2015/0293546 A1* 10/2015 Tanaka .................. G02F 1/1368
327/541
2017/0052403 A1* 2/2017 Iwato .................... G02F 1/1337

* cited by examiner

FIG.11
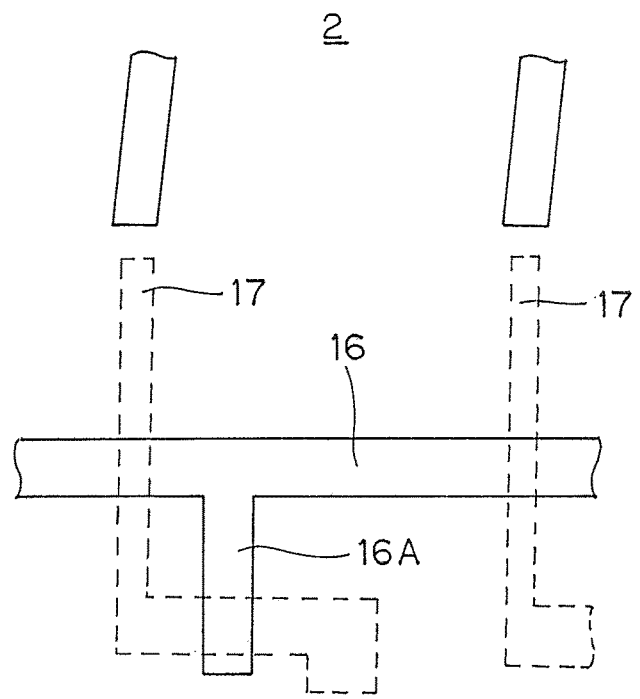
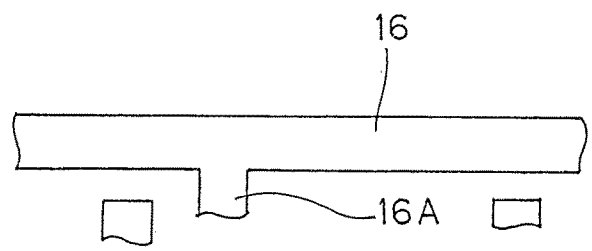

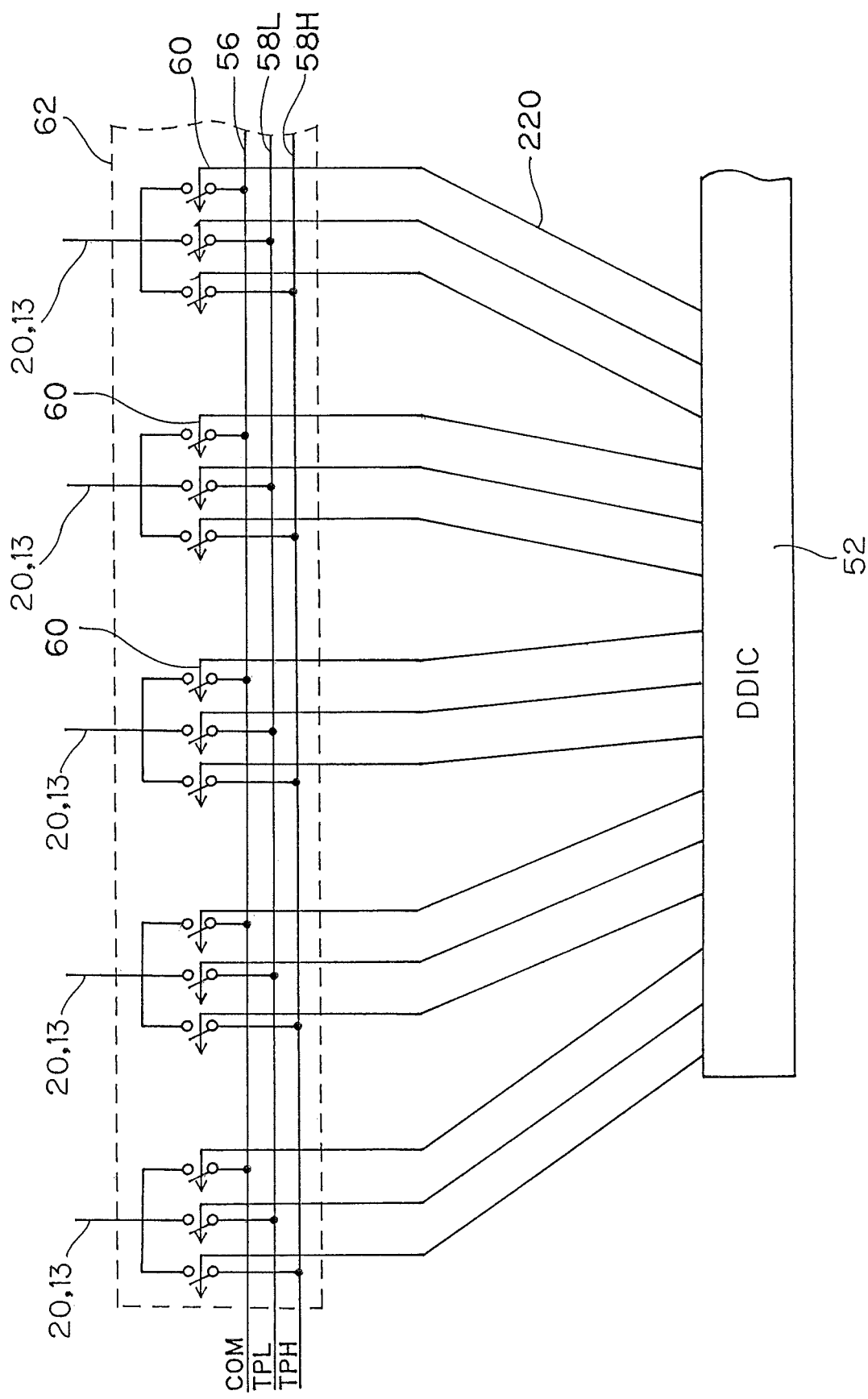

DISPLAY DEVICE

CROSS-REFERENCE TO RELATED APPLICATIONS

This application is based upon and claims the benefit of priority from the prior Japanese Patent Application No. 2017-160452, filed on Aug. 23, 2017; the entire contents of which are incorporated herein by reference.

FIELD

Embodiments of the present invention relate to a display device.

BACKGROUND

A display device such as a liquid crystal display device applies video signals supplied from a driver IC to a plurality of signal lines disposed in a display area in displaying an image. Display devices in recent years have higher resolutions and many of them have many pixels. Mobile devices typified by smart phones also have higher resolution display devices. On the other hand, since the sizes of display devices of mobile devices such as smart phones are small, the area in which wiring is disposed is limited. Accordingly, there is a proposed structure that assigns N signal lines in a display area to one lead wire from a driver IC and switches the destination of video signals using a switchover circuit provided between the driver IC and the display area to achieve high resolutions within the limited area, thereby reducing the number of wires between signal lines of the driver IC and signal lines of the display area.

Many of mobile devices in recent years not only display pictures, but also have various wireless communication functions such as Wi-Fi and NFC (Near Field Communication).

On the other hand, a display device with a switch circuit as described in PTL 1 has a problem in that the high frequency pulses of control signals used for switch operation of a switch circuit become EMI noise sources and have harmful effects on wireless communication of smart phones or the like.

Accordingly, embodiments of the invention address the above problem with an object of providing a display device that can minimize noise caused by high frequency pulses from a signal selection circuit.

BRIEF DESCRIPTION OF THE DRAWINGS

FIG. 11 is an explanatory diagram for a first process and a second process of the liquid crystal display device.

FIG. 19 is a circuit diagram of a switchover circuit.

DETAILED DESCRIPTION

Figure 1:
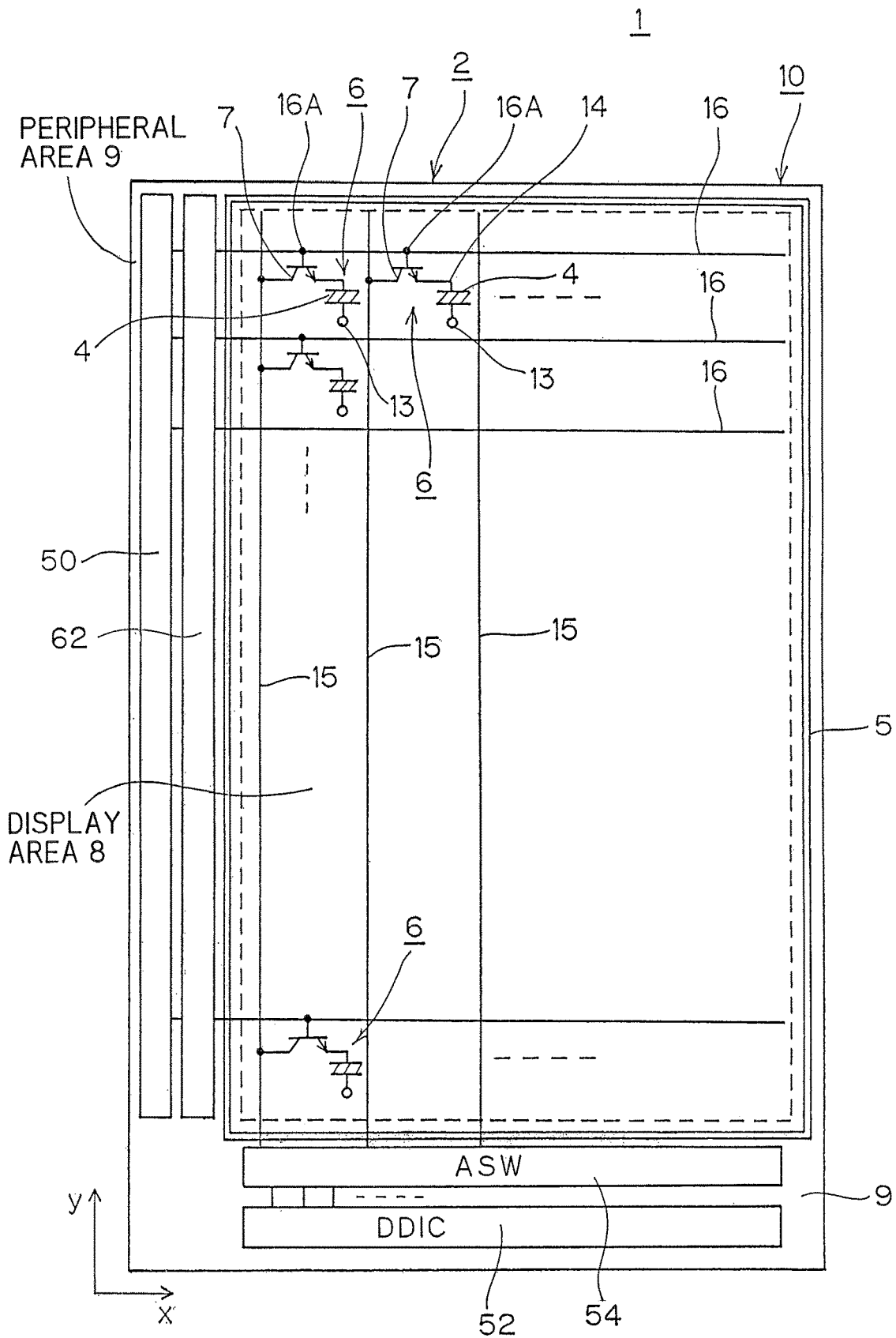
FIG. 1 is a plan view concerning pixels of a display panel of a liquid crystal display device according to embodiment 1 of the invention.

According to one embodiment, there is provided a display device including a display panel including a first board, a plurality of gate lines disposed on the first board, the gate lines including first metal lines, a plurality of signal lines disposed on the first board so as to intersect with the gate lines, the signal lines including second metal lines, a plurality of switching elements disposed on the first board, the switching elements being provided in positions in which the gate lines intersect with the signal lines, respectively, a plurality of universal electrodes disposed on the first board, the universal electrodes including first transparent electrodes extending in one direction, a plurality of pixel electrodes disposed on the first board, the pixel electrodes including second transparent electrodes connected to the switching elements, respectively, a signal line driver disposed in a peripheral area surrounding a display area of the display panel, the signal line driver outputting a video signal, a signal selection circuit disposed in the peripheral area, the signal selection circuit distributing the video signal output from the signal line driver among the signal lines, a plurality of connection lines disposed in the peripheral area, the connection lines making connection between the signal line driver and the signal selection circuit, and a shield layer formed in a position that overlaps with the plurality of connection lines in an area excluding the signal selection circuit in plan view, the shield layer being made of the same material as the second transparent electrodes.

According to another embodiment, there is provided a display device including a display panel including a first board, a plurality of gate lines disposed on the first board, the gate lines including first metal lines, a plurality of signal lines disposed on the first board so as to intersect with the gate lines, the signal lines including second metal lines, a plurality of switching elements disposed on the first board, the switching elements being provided in positions in which the gate lines intersect with the signal lines, respectively, a plurality of universal electrodes disposed on the first board, the universal electrodes including the first transparent electrodes extending in one direction, a plurality of pixel electrodes disposed on the first board, the pixel electrodes including the second transparent electrodes connected to the switching elements, respectively, a signal line driver disposed in a peripheral area surrounding a display area of the display panel, the signal line driver outputting video signals, a signal selection circuit disposed in the peripheral area, the signal selection circuit distributing the video signal output from the signal line driver among the signal lines, a plurality of first connection lines disposed in the peripheral area, the first connection lines making connection between the signal line driver and the signal selection circuit, a switchover circuit disposed in the peripheral area, the universal electrodes performing switchover between supply of a common voltage to the universal electrodes to display an image and supply of a transmission signal for use as a touch sensor, second connection lines disposed in the peripheral area, the second connection lines making connection between the switchover circuit and the universal electrodes, and a shield layer formed in a position that overlaps with the first connection lines in an area excluding the signal selection circuit, the switchover circuit, and the second connection lines in plan view, the shield layer being made of the same material as the second transparent electrodes.

In the embodiments, display devices having a display panel provided with a liquid crystal display element having a touch panel function are disclosed as examples of a display device. However, the embodiments do not prevent the technical concepts disclosed in the embodiments from being applied to a display device having a display element other than a liquid crystal display element. A display element other than a liquid crystal display element may be a display panel such as a self-luminous display panel having an organic electroluminescence display element or the like, or an electronic paper type display panel having an electrophoresis element or the like.

A liquid crystal display device according to an embodiment of the invention will be described with reference to the drawings. It should be noted here that the disclosure in the embodiment of the invention is only an example and appropriate changes, suited to the purpose of the invention, that can be easily reached by those skilled in the art are of course included in the scope of the invention. In addition, although the width, thickness, shape, and the like of each component in a drawing may be schematically illustrated to clarify description as compared with actual implementation, this is only an example and do not limit the interpretation of the invention. In addition, in this specification and the drawings, the same components as in drawings having been described are given the same reference numerals to omit detailed description as appropriate.

The liquid crystal display devices in the embodiments are of horizontal electric field type referred to as an IPS (In-Plane Switching) system in a specific example, particularly a FFS (Fringe Field Switching) system that uses fringe electric field as an example of an IPS system.

Embodiment 1

The liquid crystal display device according to embodiment 1 will be described with reference to FIG. 1 to FIG. 15.
(1) Entire Structure of Display Panel 1

The display panel 1 of the liquid crystal display device is formed by an array substrate 2, an opposing substrate 3, a liquid crystal layer 4 held a space therebetween, and a seal member 5 that seals the liquid crystal layer 4 by bonding peripheral area 9 of both substrates 2 and 3 together. The display panel 1 includes a display area 8 in which an image is displayed and the peripheral area 9 surrounding the display area 8.
(2) Structure of Display Panel 1

The circuit structure of the display panel 1 will be described with reference to FIG. 1.

As illustrated in FIG. 1, in the display area 8 of a glass substrate 10 of the array substrate 2, gate lines 16 extending in a lateral direction (x axis direction) and signal lines 15 extending in a longitudinal direction (y axis direction) are orthogonally arranged with each other to form pixels 6 at the intersection points thereof. Each of the pixels 6 has an n-channel or p-channel TFT (thin film transistor) 7, which is a switching element, and a pixel electrode 14. The gate electrode of the TFT 7 is connected to the gate line 16 and the source electrode is connected to the signal line 15, and the drain electrode is connected to the pixel electrode 14.

A signal line driver (DDIC) 52 and a signal selection circuit (ASW) 54A are provided in a lower peripheral area 9 of the array substrate 2. The signal line driver 52 outputs RGB image signals to the signal lines 15 based on signals from the outside.

A gate driver 50 is provided in the left peripheral area 9 of the glass substrate 10 along the longitudinal direction. This gate driver 50 outputs gate signals to the gate lines 16.
(3) Signal Selection Circuit 54

The signal selection circuit 54 will be described.

Figure 15:
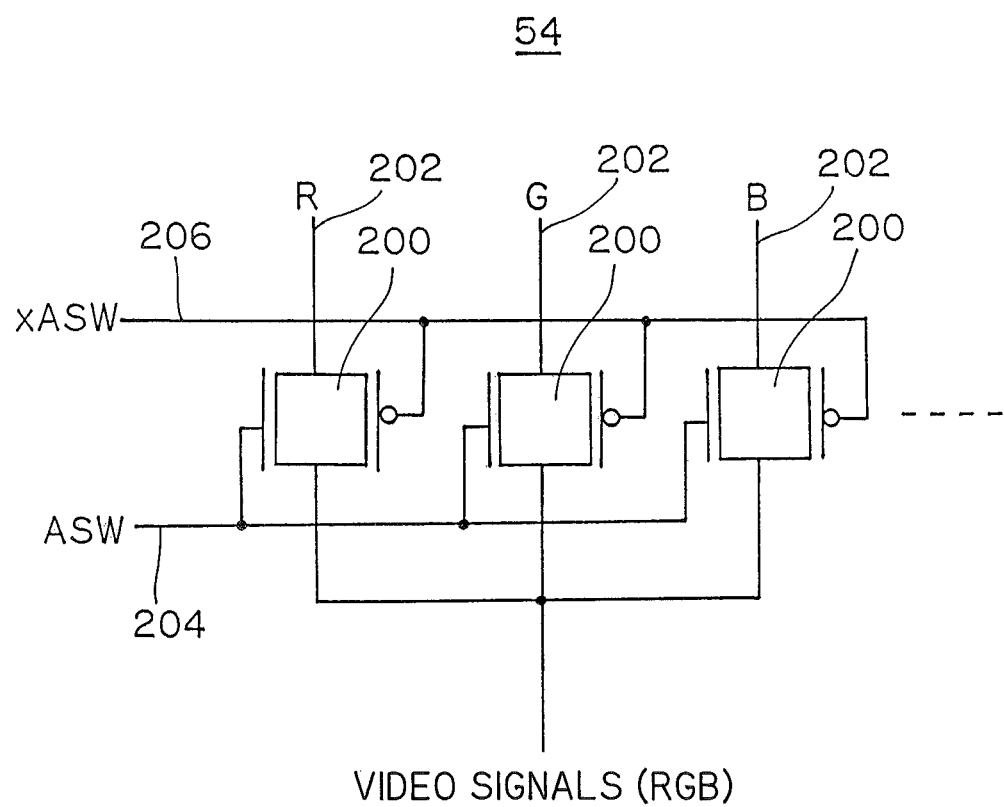
FIG. 15 is a circuit diagram of a signal selection circuit.

As illustrated in FIG. 15, in the signal selection circuit 54, an analog switch 200 having a combination of an n-type switch and a p-type switch of MOSFETs is provided for each of the signal lines 15.

RGB video signals are input to input ends of the analog switches 200 from the signal line driver 52.

A first open-close signal wire 204 and a second open-close signal wire 206 are connected to control terminals of the analog switches 200 and a first open-close signal ASW and a second open-close signal xASW are input from the signal line driver 52. The signal line driver 52 outputs the first open-close signal ASW and the second open-close signal xASW at a timing at which an image is displayed. A set of the analog switches 200 is configured by three RGB pixel arrays and transmits the video signals (RGB) using the first open-close signal ASW and the second open-close signal xASW obtained from the signal line driver 52 while switching to the signal line 15 of each color on a time-series basis.

The analog switches 200 and various wires included in the signal selection circuit 54 are formed on the same layer and made of the same material as the TFTs 7, the gate lines 16, and the signal lines 15 in the display area.
(4) Touch Sensor The structure of a touch sensor will be described with reference to FIG. 2.

On the array substrate 2, universal electrodes 13 that function as common electrodes and first sensor electrodes (transmission electrodes or Tx electrodes) extending in the lateral direction (x axis direction) are provided at predetermined intervals in the longitudinal direction (y axis direction).

A switchover circuit (COMSW) 62 is provided between the left side of the universal electrodes 13 extending to the left peripheral area 9 of the array substrate 2 and the gate driver 50. This switchover circuit 62 performs switchover between supply of a DC common voltage to the universal electrodes 13 to display an image and supply of a detection signal for use as a touch sensor and is driven by a universal electrode driver (not illustrated) including a shift register.

On the surface of the opposing substrate 3, second sensor electrodes (reception electrodes or Rx electrodes) 112 extending in the longitudinal direction (y axis direction) (referred to below simply as "sensor electrode") indicated by dot-dot-dash lines are provided at predetermined intervals in the lateral direction (x axis direction). The lower ends of the sensor electrodes 112 are connected to a second sensor control unit 64 provided in the lower peripheral area 9 of the array substrate 2.

When the liquid crystal display device is used as a mutual capacitance touch sensor, a changeover switches 60 switch to the positions of the sensor feeder lines 58, the detection signal is supplied to the universal electrodes 13, the capacitance between the sensor electrodes 112 and the universal electrodes 13 changes when a finger of a person makes contact with or approaches the sensor electrodes 112, and the second sensor control unit 64 detects the change in the capacitance and the position in which the capacitance has changed.

In addition, the sensor electrodes 112 are not necessary depending on the type of a touch sensor and the self-capacitance structure that enables touch sensing by using the electrodes of only the array substrate 2 may be used. The embodiment of the invention is also applicable even in this case.

(5) Pixel 6

Figure 3:
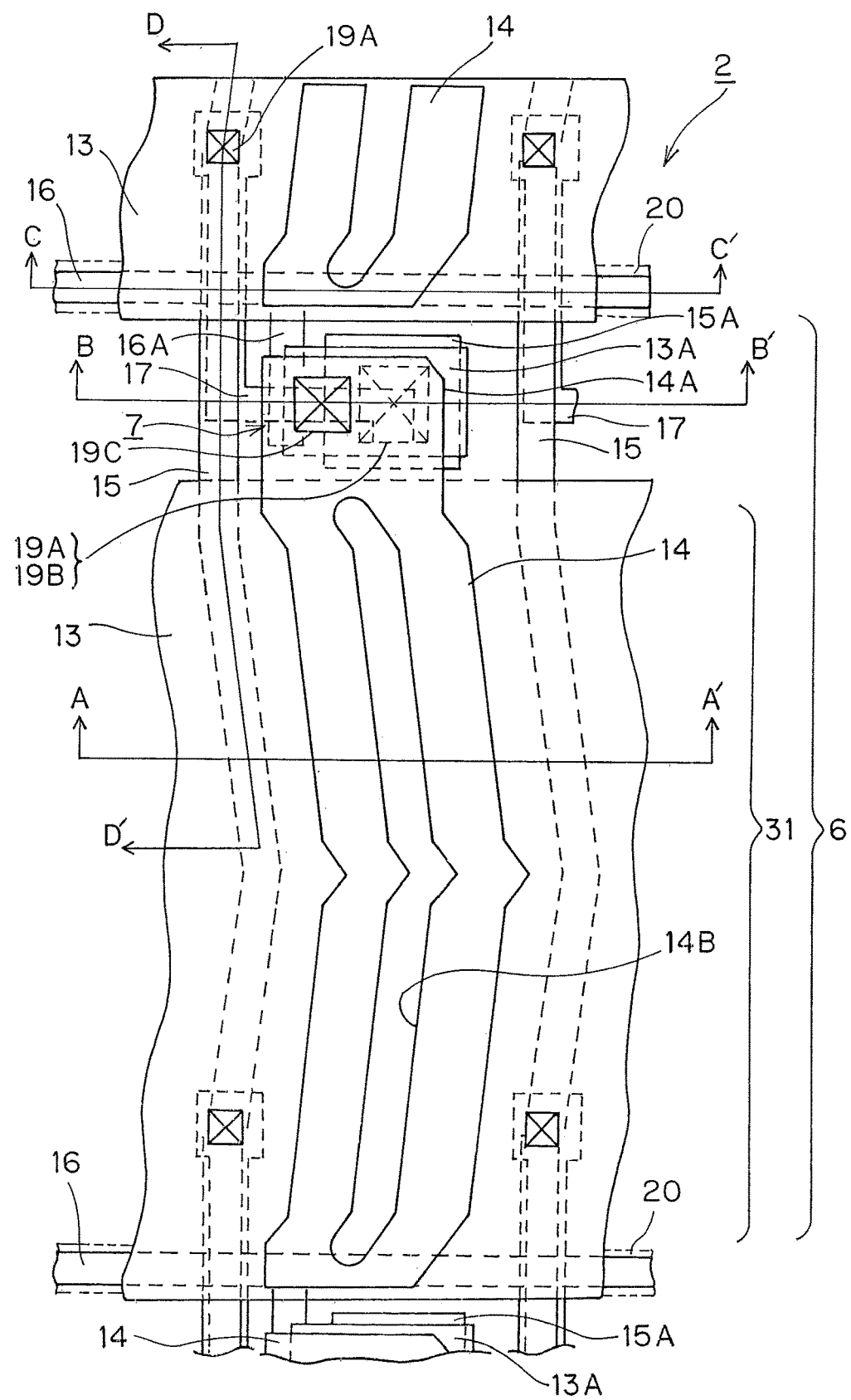
FIG. 3 is an enlarged plan view illustrating pixels.

The structure of the pixel 6 will be described with reference to FIG. 3. As illustrated in FIG. 3, the pixel 6 extends long along the direction of the signal line 15 and almost all of the area thereof disposed in the longitudinal direction corresponds to a pixel opening part 31 and the pixel electrode 14 having a slit 14B is disposed in this section. The TFT 7 is formed in one end part of the pixel 6 and a pixel electrode extending part 14A extending from the pixel electrode 14 is disposed. The slit 14B enables an electric field to be generated between the pixel electrode 14 and the universal electrode 13.

(6) Array Substrate 2

The structure of the array substrate 2 will be described with reference to FIG. 3 to FIG. 7.

Figure 5:
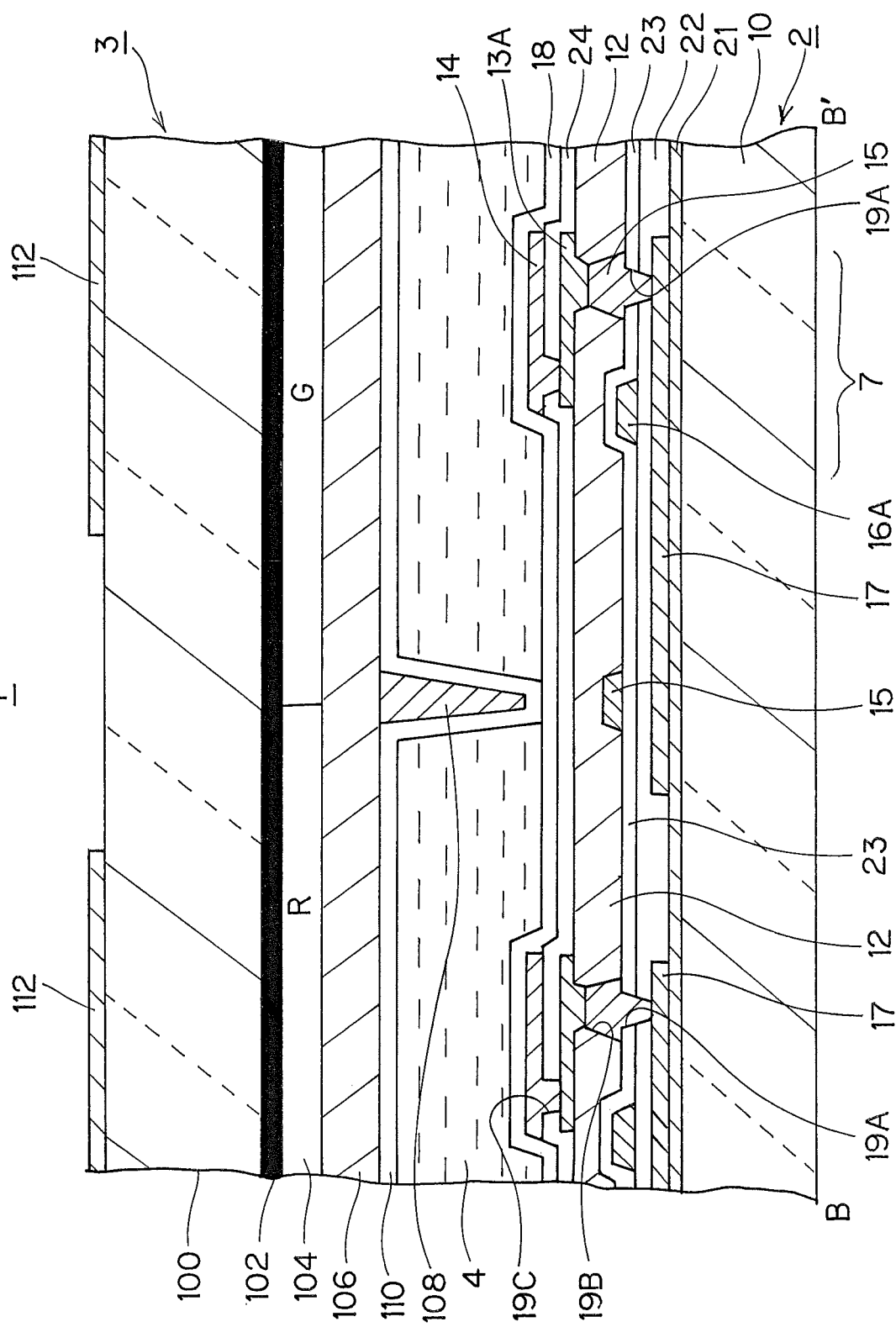
FIG. 5 is a cross sectional view taken along line B-B' in FIG. 3.

An undercoat layer 21 is formed on the glass substrate 10 of the array substrate 2 and a semiconductor layer 17 constituting the semiconductor of the TFT 7 is formed thereon (see FIG. 5).

Agate insulation film 22 is formed on the semiconductor layer 17 (see FIG. 5).

Figure 6:
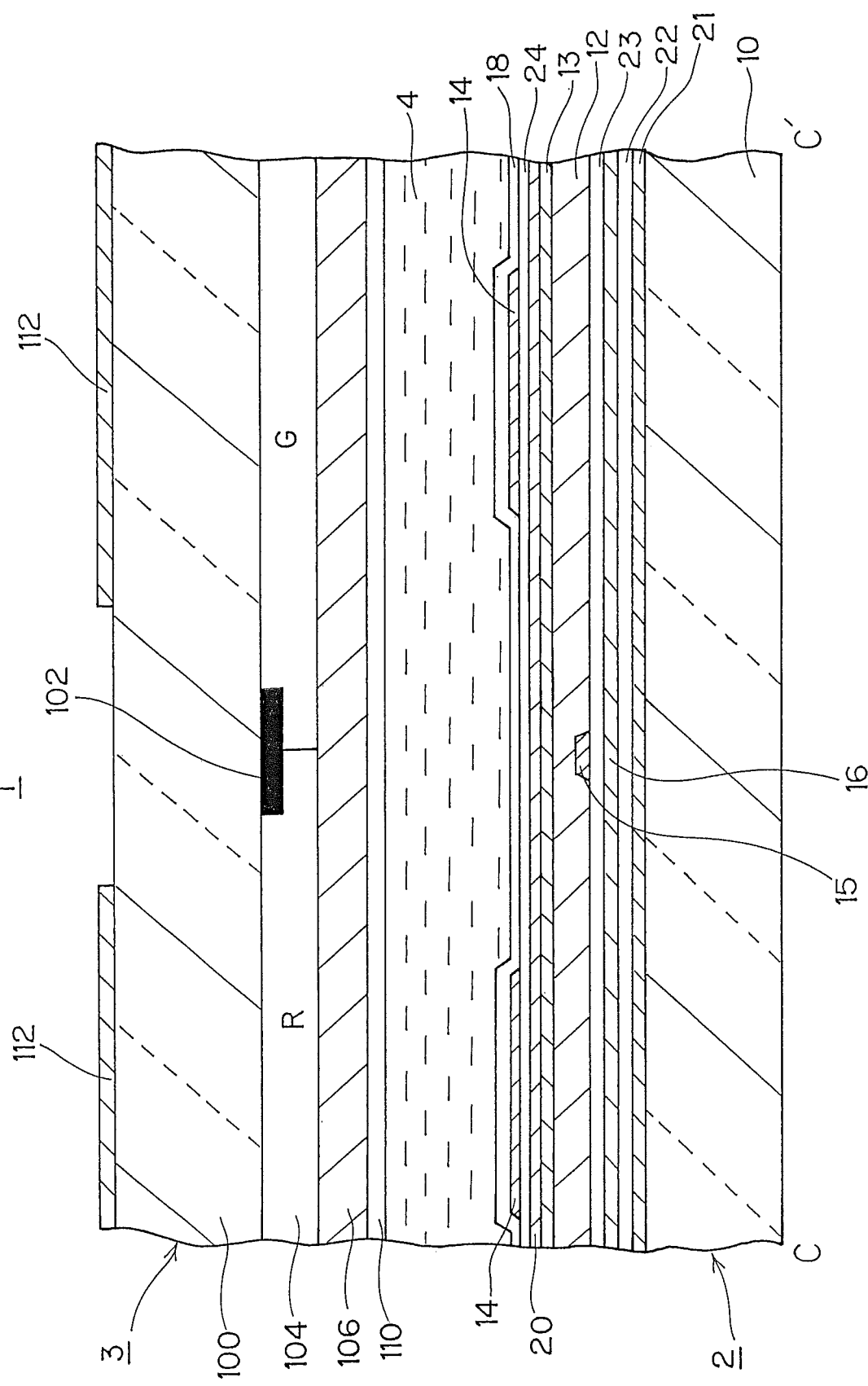
FIG. 6 is a cross sectional view taken along line C-C' in FIG. 3.
Figure 7:
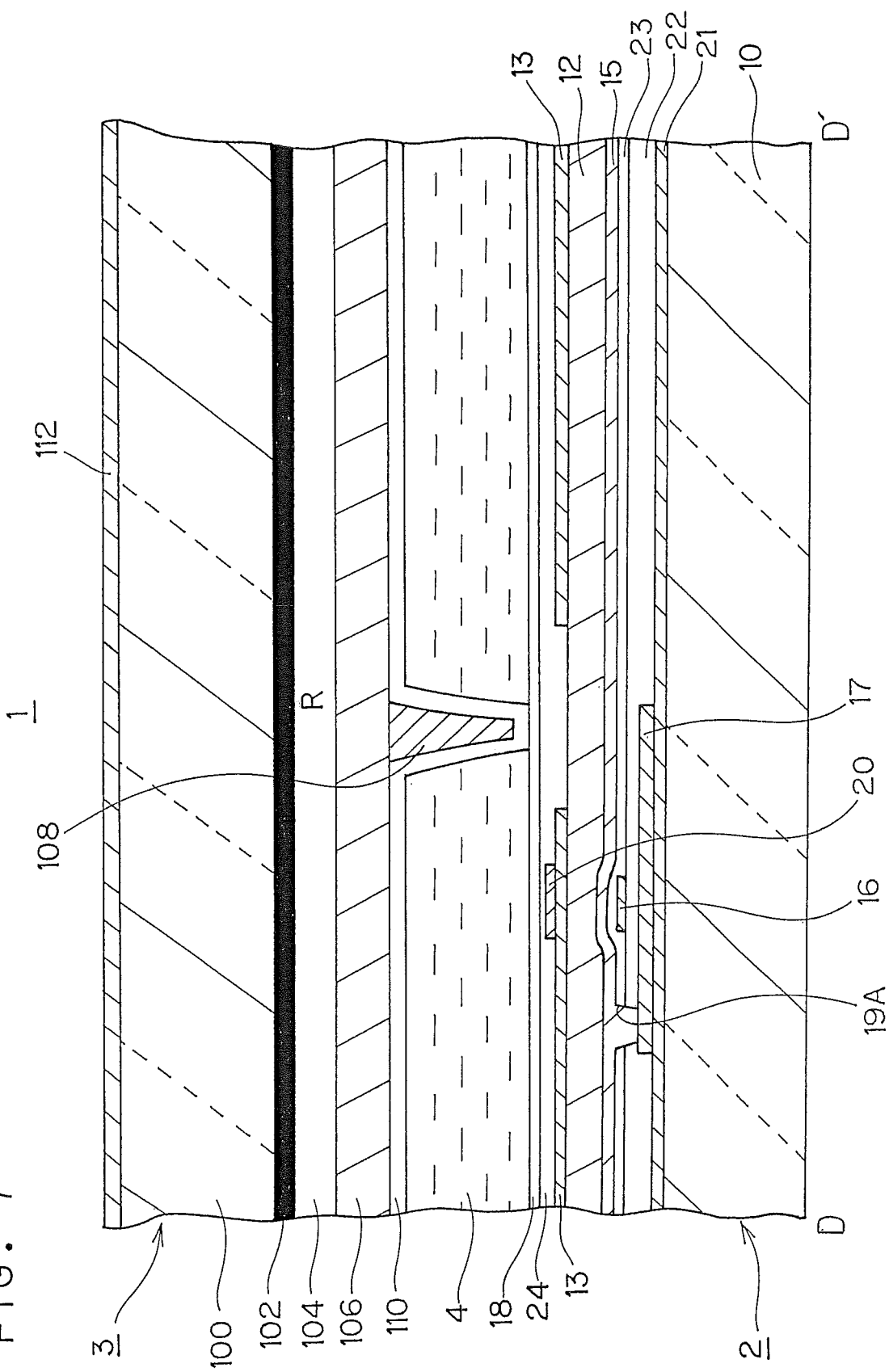
FIG. 7 is a cross sectional view taken along line D-D' in FIG. 3.

The gate lines (first metal lines) 16 are formed on the gate insulation film 22 at predetermined intervals in the lateral direction (x axis direction) in parallel to each other (see FIG. 6 and FIG. 7). In the parts of the gate lines 16 corresponding to the TFTs 7, gate electrode branch lines 16A to be connected to the TFTs 7 extend in the longitudinal direction (see FIG. 5 and FIG. 11).

The first insulation film 23 is formed on the gate lines 16 and the gate electrode branch lines 16A (see FIG. 3 to FIG. 7).

The signal lines 15 (second metal lines) are formed on the first insulation film 23 in the longitudinal direction (y axis direction) (see FIG. 5 and FIG. 6).

An organic insulation film (planarizing film) 12 is formed on the signal lines 15.

Figure 2:
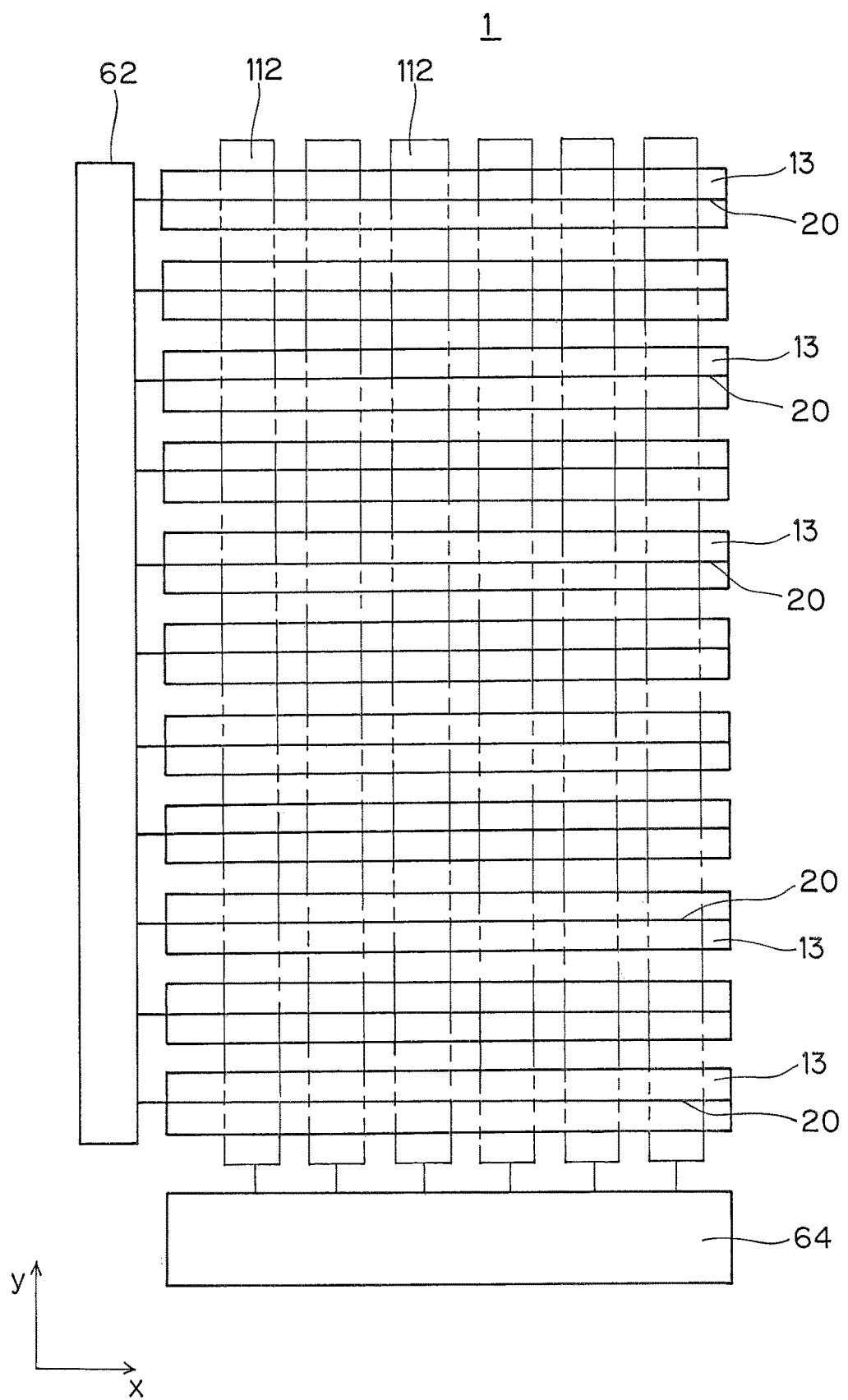
FIG. 2 illustrates the relationship between universal electrodes and second sensor electrodes.

On the organic insulation film 12, the universal electrodes 13, which are first transparent conductive electrodes made of a transparent conductive material such as ITO or IZO, extend in the lateral direction (x axis direction) so as to be arranged at predetermined intervals in the longitudinal direction (y axis direction) (see FIG. 2 and FIG. 6).

The third metal lines 20 are formed in the lateral direction on the universal electrodes 13 above the gate lines 16 (see FIG. 6).

A second insulation film 24 is formed on the third metal line 20, the universal electrode 13, and the like (see FIG. 3 to FIG. 7).

Figure 4:
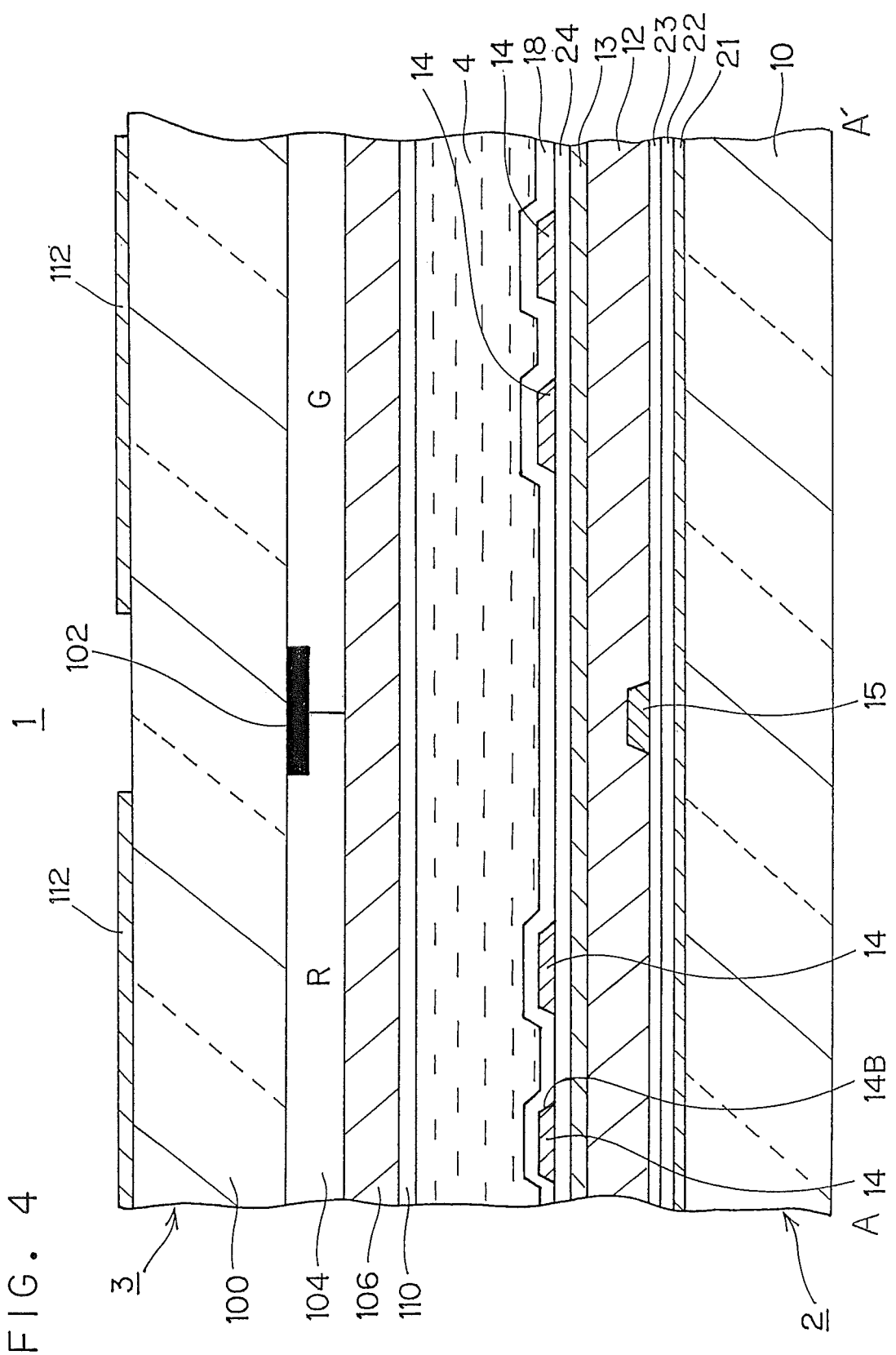
FIG. 4 is a cross sectional view taken along line A-A' in FIG. 3.

The pixel electrodes 14, which are the second transparent electrodes made of a transparent conductive material such as ITO or IZO, are disposed on the second insulation film 24 (see FIG. 4 and FIG. 6).

An alignment film 18 is formed on the second insulation film 24 and the pixel electrodes 14 (see FIG. 3 to FIG. 7). This alignment film 18 makes contact with the liquid crystal layer 4. The alignment film 18 is subject to alignment processing by rubbing processing or optical alignment processing.

(7) Opposing Substrate 3

The opposing substrate 3 will be described with reference to FIG. 4 to FIG. 7.

A grid-like black matrix 102 made of a black resin material is formed below the glass substrate 100 of the opposing substrate 3. The black matrix 102 is formed like a grid by a longitudinal part extending along the signal lines 15 so as to cover the signal lines 15 and the vicinity thereof and a lateral part continuously extending along the TFTs 7 and the gate lines 16. The grid-like openings of the black matrix 102 correspond to the pixel opening parts 31.

A color filter layer 104 including R (red), G (green), and B (blue) is formed below the black matrix 102.

The overcoat layer 106 made of resin is formed below the color filter layer 104.

A spacer 108 is formed below the overcoat layer 106. The spacer 108 may be provided every a plurality of pixels 6, for example, every four pixels 6 or every eight pixels 6. The spacer 108 can be used to maintain the thickness of the liquid crystal layer 4 (see FIG. 5 and FIG. 7).

An alignment film 110 is formed below the overcoat layer 106 and the spacer 108 and the alignment film 110 makes contact with the liquid crystal layer 4.

The sensor electrodes (second sensor electrodes) 112 extending along the longitudinal direction are formed at predetermined intervals in the lateral direction on the glass substrate 100 of the opposing substrate 3 (see FIG. 2 and FIG. 4 to FIG. 7).

(8) Lower Peripheral Area 9 of Array Substrate 2

Figure 8:
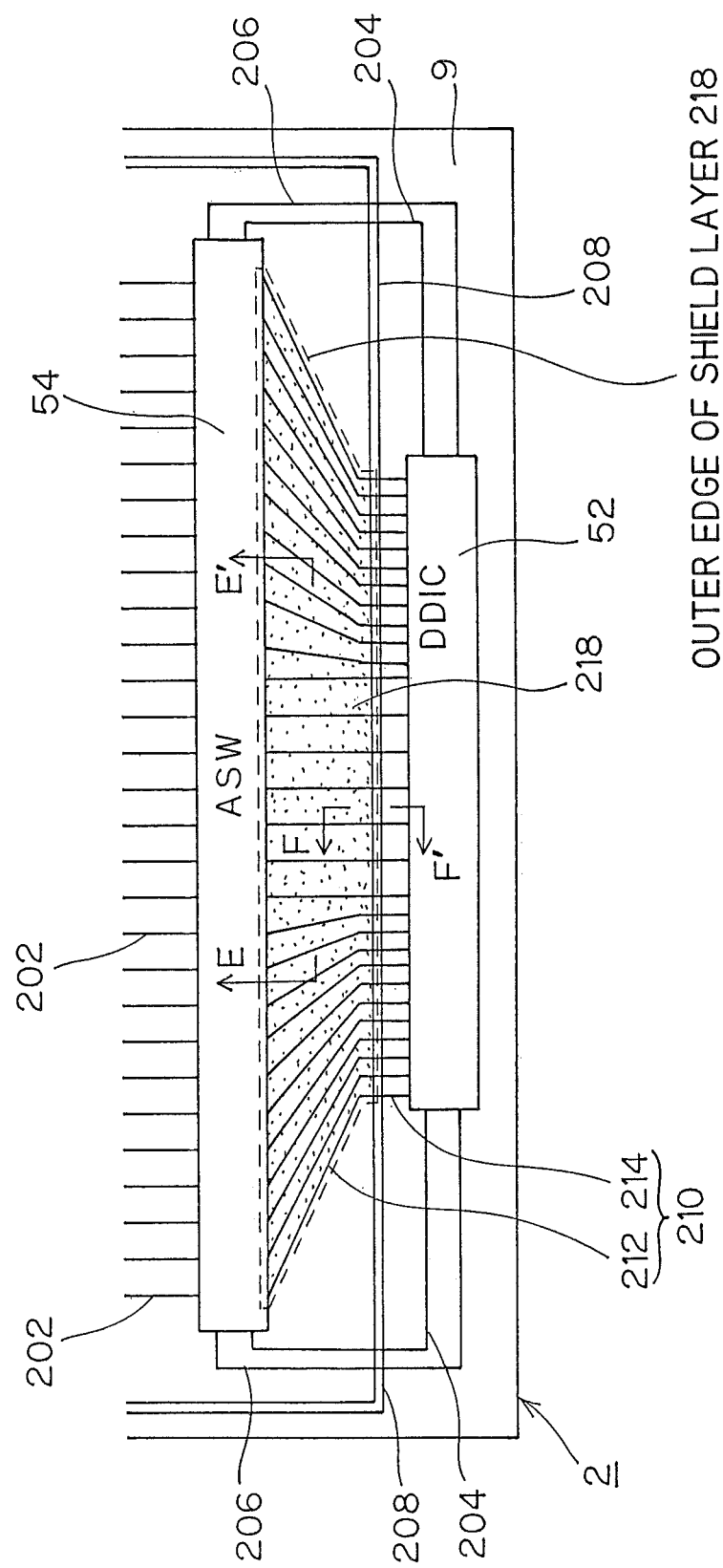
FIG. 8 is a plan view illustrating a lower peripheral area of an array substrate.

Next, the structure of the lower peripheral area 9 of the array substrate 2 will be described. As illustrated in FIG. 8, the signal line driver (DDIC) 52 and the signal selection circuit (ASW) 54 are provided in the lower peripheral area 9. In the lower peripheral area 9, a groove 208 is provided on the organic insulation film 12 along the x direction between the signal selection circuit 54 and the signal line driver 52 provided outside the signal selection circuit 54. The wiring structure near here will be described with reference to FIG. 8 to FIG. 10.

The signal selection circuit 54 will be described. As illustrated in FIG. 8, leader lines 202 electrically connected to the signal lines 15 are connected to the signal selection circuit 54. Since this signal selection circuit 54 is formed using the same layer as in the signal lines 15, the gate lines 16, and the semiconductor layer 17, the signal selection circuit 54 is formed below the organic insulation film 12.

Figure 10:
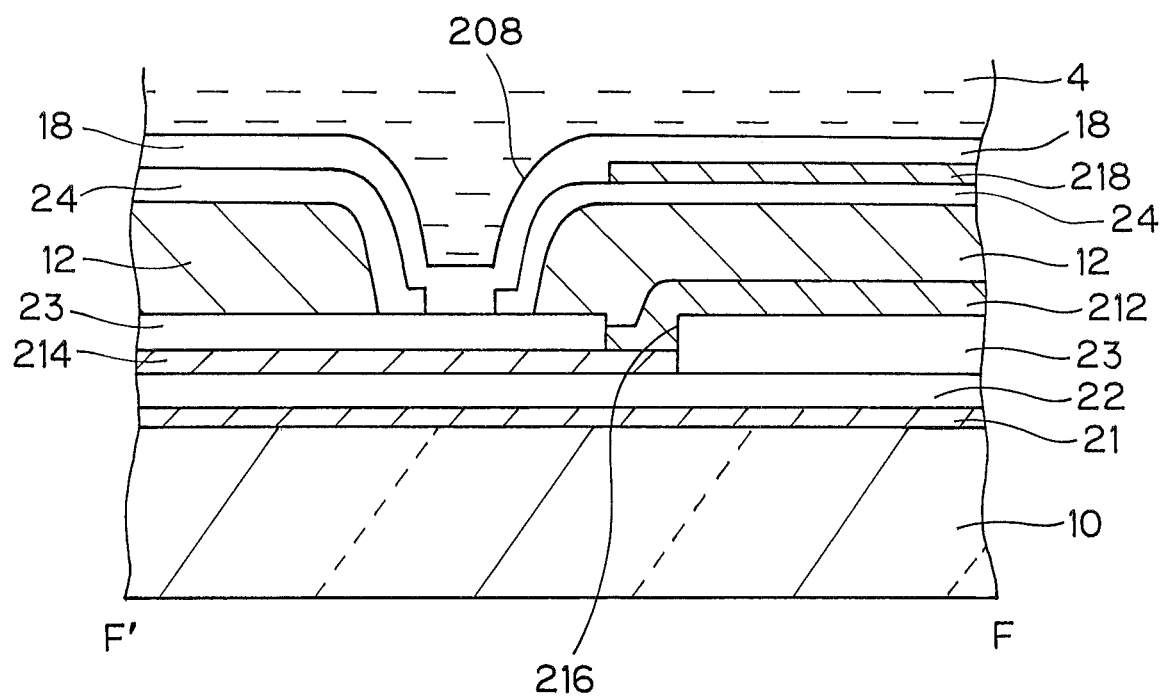
FIG. 10 is a cross sectional view taken along line F-F' in FIG. 8.

Connection lines 210 connected from the signal selection circuit 54 to the signal line driver 52 as illustrated in FIG. 8 include first connection lines 212 extending from the signal selection circuit 54 and second connection lines 214 extending from the signal line driver 52 as illustrated in FIG. 10 and the first connection lines 212 and the second connection lines 214 are connected to each other via contact holes 216.

The first connection lines 212 are made of the same material as the signal lines 15 (that is, the second metal lines) and the second connection lines 214 are made of the same material as the gate lines 16 (that is, the first metal lines). As illustrated in FIG. 10, the contact holes 216 are formed on the part of the first insulation film 23 closer to the display area than the groove 208. The first connection lines 212 and the second connection lines 214 are electrically connected to each other via the contact holes 216. The groove 208 is formed by grinding the organic insulation film 12, the alignment film 18 is formed thereon, and the liquid crystal layer 4 is formed on the alignment film 18. This groove 208 is provided to prevent intrusion of water into the display panel 1 by cutting off the part of the organic insulation film 12 exposed to the outside from the part of the organic insulation film 12 disposed close to the display area 8 since the organic insulation film 12 absorbs water.

Figure 9:
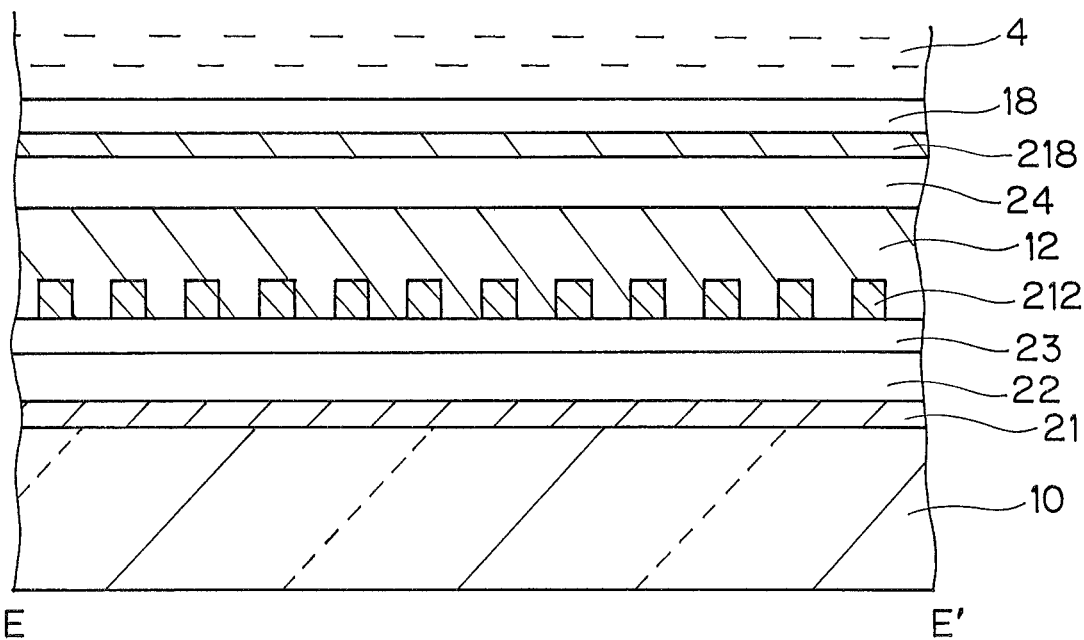
FIG. 9 is a cross sectional view taken along line E-E' in FIG. 8.

As illustrated in FIG. 8, FIG. 9, and FIG. 10, a shield layer 218 is formed as an upper layer of the connection lines 210 present between the signal selection circuit 54 and the groove 208 on the surface excluding the signal selection circuit 54. In FIG. 8, the area covered with the shield layer 218 is indicated as the area including a plurality of points and the outer edge of the shield layer 218 is indicated by a dotted line. The shield layer 218 is not formed on the signal selection circuit 54 to prevent the wiring capacity between the shield layer 218 and the signal selection circuit 54 from increasing. The shield layer 218 is made of the same material as the second transparent electrodes that form the pixel electrodes 14.

(9) Manufacturing Process of Array Substrate 2

The manufacturing process of the array substrate 2 will be schematically described with reference to FIG. 11 to FIG. 14.

In the first process, the undercoat layer 21 is formed on the glass substrate 10 of the array substrate 2 as illustrated in FIG. 11. Next, the semiconductor layer 17 is formed on the undercoat layer 21 in the longitudinal direction for each of the pixels 6. Next, the semiconductor layers 17 and the entire array substrate 2 are covered with the gate insulation film 22 formed by a silicon oxide film, a silicon nitride film, or the like.

In the second process, the gate lines 16 extending in the lateral direction, the gate electrode branch lines 16A extending in the longitudinal direction from the gate lines 16, and gate lead lines extending from the end parts of the gate lines 16 are formed by a metal layer made of molybdenum alloy or the like, as illustrated in FIG. 11. In addition, in the lower peripheral area 9, the second connection lines 214 are also formed by first metal lines as in the gate lines 16. Next, the entire array substrate 2 as well as these lines is covered with the first insulation film 23 formed by a silicon oxide film, a silicon nitride film, or the like.

Figure 12:
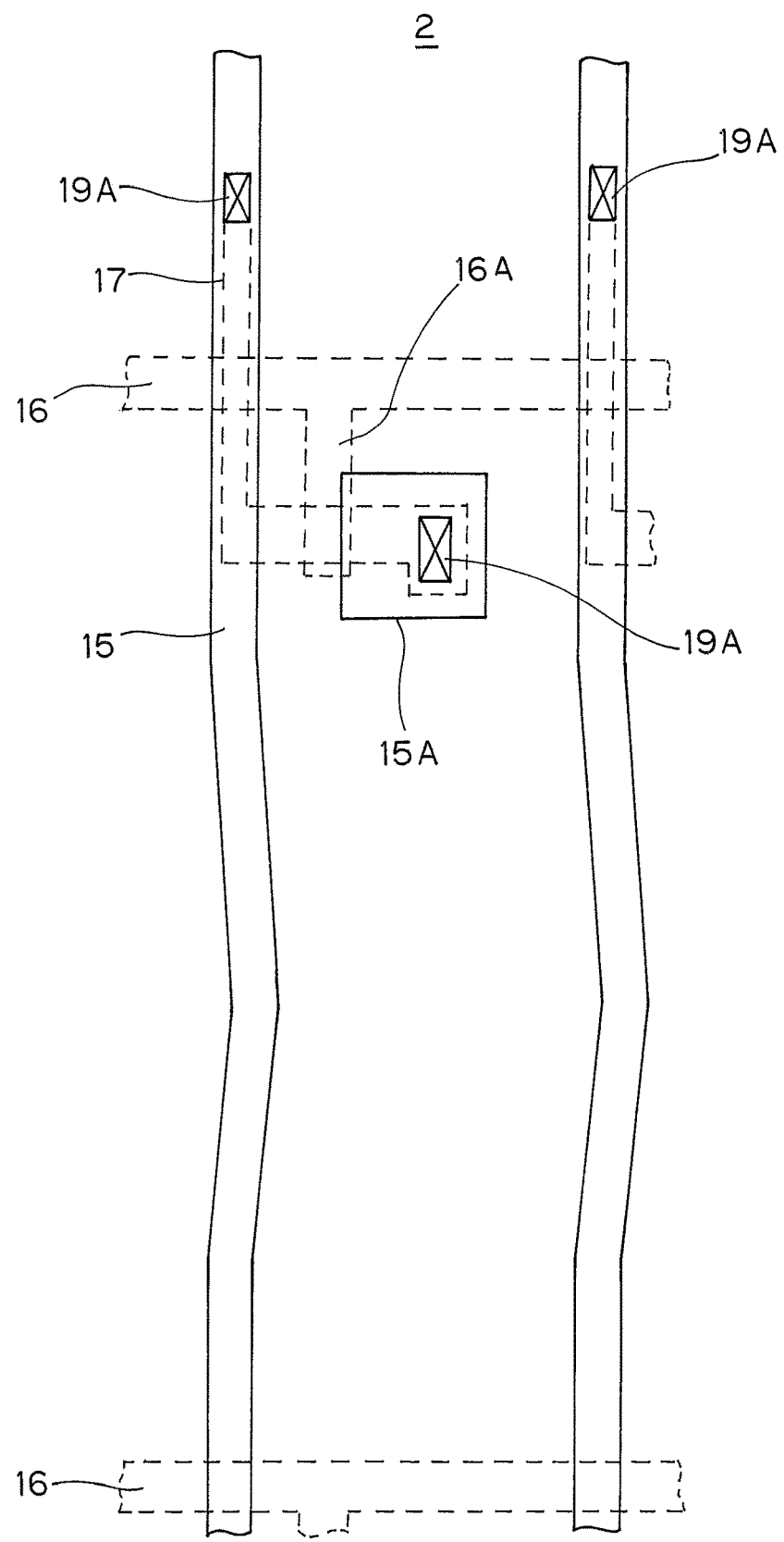
FIG. 12 is an explanatory diagram for a third process and a fourth process.

In the third process, contact holes 19A and 19A that penetrate through the first insulation film 23 and the gate insulation film 22 and expose both end parts of the semiconductor layer 17 are formed, as illustrated in FIG. 12. In addition, the contact holes 216 are formed in the first insulation film 23 in the lower peripheral area 9 (see FIG. 10).

In the fourth process, the signal lines 15, which are second metal lines, are formed in the longitudinal direction on first metal lines 16B on the first insulation film 23 using metal such as aluminum or aluminum alloy (for example, TAT (Ti/Al/Ti)), as illustrated in FIG. 12. At this time, first island-shaped patterns 15A are formed in the contact holes 19A close to the TFTs 7 using the same material. In addition, the first connection lines 212 are also formed using the same material as the second metal lines as illustrated in FIG. 10 in the lower peripheral area 9. Then, the first connection lines 212 and the second connection lines 214 are connected to each other via the contact holes 216.

In the fifth process, the transparent organic insulation film 12 having array projecting parts 11 is formed so as to cover the signal lines 15 and the first island-shaped patterns 15A. At this time, the groove 208 is also formed in the lower peripheral area 9 as illustrated in FIG. 10. Next, contact holes 19B that expose part of the first island-shaped pattern 15A are formed (see FIG. 13).

Figure 13:
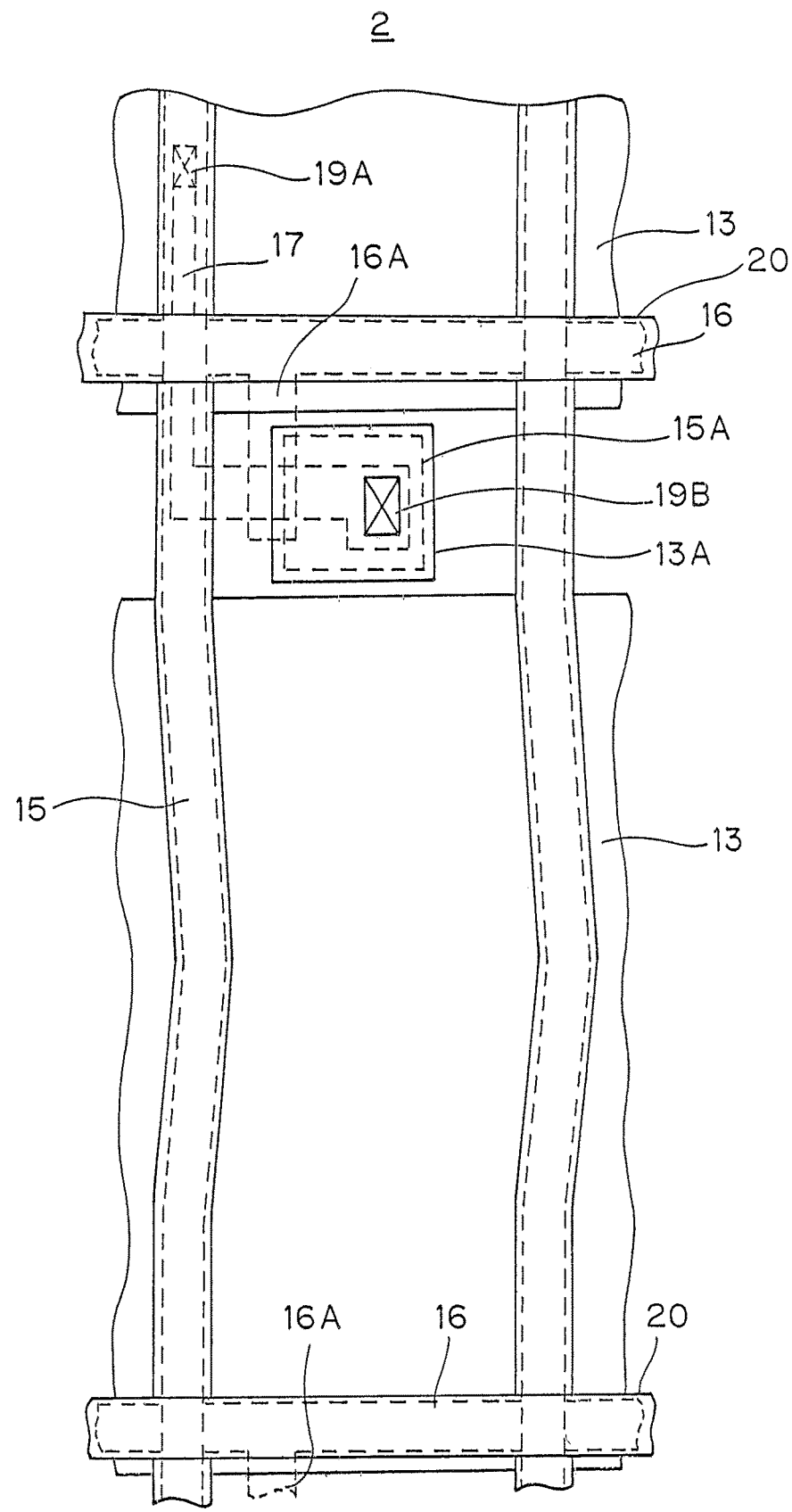
FIG. 13 is an explanatory diagram for a fifth process and a seventh process.

In the sixth process, the universal electrodes 13, which are first transparent conductive electrodes made of a transparent conductive material such as ITO or IZO, are formed on the organic insulation film 12, as illustrated in FIG. 13. At this time, second island-shaped patterns 13A are formed in the part of the TFTs 7 using the same material. The universal electrodes 13 are formed in the lateral direction so as to cover the pixels 6 arranged in the lateral direction, as illustrated in FIG. 2.

In the seventh process, the third metal lines 20 are formed on the gate lines 16 on the universal electrode 13 as illustrated in FIG. 13. The material of the third metal lines 20 is, for example, MAM (Mo/Al/Mo).

Figure 14:
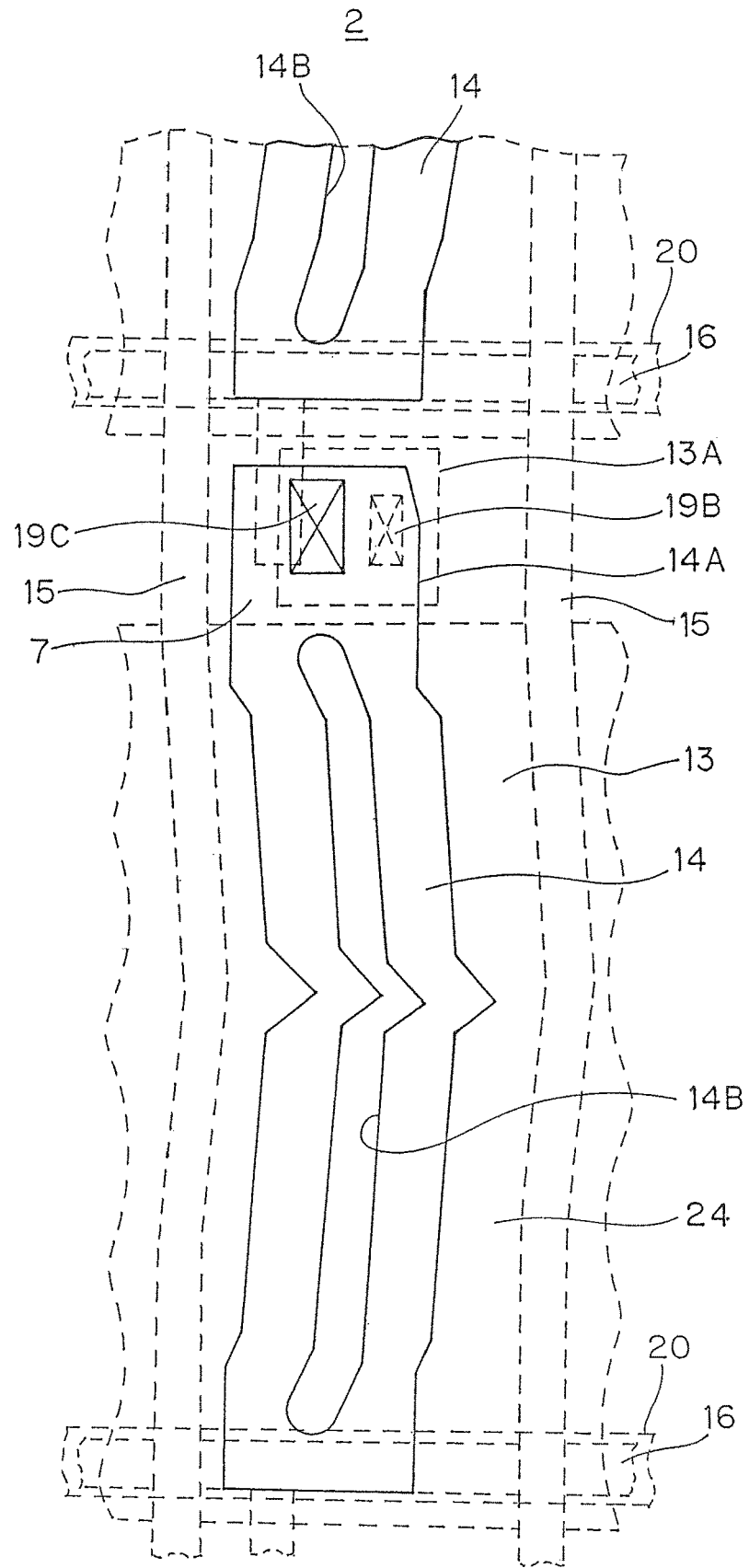
FIG. 14 is an explanatory diagram for an eighth process and a ninth process.

In the eighth process, the second insulation film 24 that covers the universal electrode 13, the third metal line 20, and the like is formed across the array substrate 2, as illustrated in FIG. 14. Next, as illustrated in FIG. 14, contact holes 19C that expose part of the second island-shaped patterns 13A are formed in the second insulation film 24.

In the ninth process, the pixel electrodes 14, which are the second transparent electrodes made of a transparent conductive material such as ITO or IZO, are formed as illustrated in FIG. 14. The slits 14B are formed along the signal lines 15 in the pixel electrodes 14. In addition, the shield layer 218 is formed using the same material as the second transparent electrodes in the lower peripheral area 9 (see FIG. 8 and FIG. 9).

In the tenth process, the alignment film 18 made of resin is formed across the array substrate 2. Finally, optical alignment processing by ultraviolet irradiation is performed.

(10) Effects

Since video signals having different electric potentials flow through the connection lines 210 from the signal line driver 52 to the signal selection circuit 54 while changing in potentials constantly, high frequency pulses are generated, thereby becoming EMI noise sources. Since the shield layer 218 is provided as an upper layer of the connection lines 210 present from the signal selection circuit 54 to the groove 208 according to the embodiment, it is possible to prevent EMI noise caused by control pulses from the signal line driver 52 for the signal selection circuit 54 from being emitted peripherally.

In addition, the shield layer 218 is not formed on the signal selection circuit 54 in the embodiment to prevent the wiring capacity generated between the shield layer 218 and the signal selection circuit 54 from increasing.

Embodiment 2

Next, a liquid crystal display device according to embodiment 2 will be described with reference to FIG. 16 to FIG. 19. In embodiment 1, the universal electrodes 13 are provided along the lateral direction (x axis direction) on the array substrate 2 and the sensor electrodes 112 are provided along the longitudinal direction (y axis direction) on the opposing substrate 3. In contrast, in embodiment 2, the universal electrodes 13 are provided along the longitudinal direction (y axis direction) parallel to the signal lines 15 on the array substrate 2 and the sensor electrodes 112 are provided along the x axis direction parallel to the gate lines 16 on the opposing substrate 3.

Figure 16:
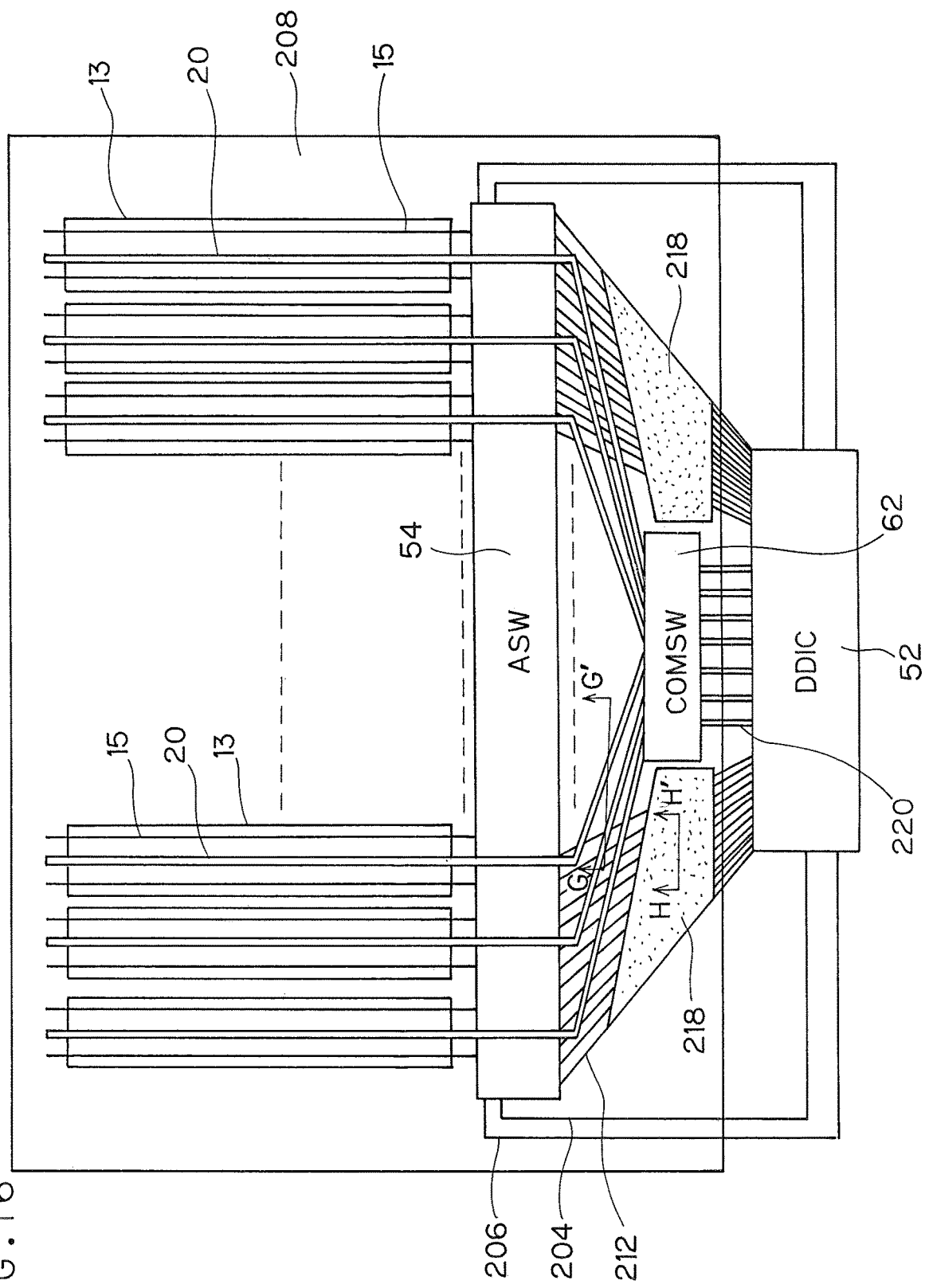
FIG. 16 is a plan view illustrating a lower peripheral area of an array substrate according to embodiment 2.

As illustrated in FIG. 16, in the embodiment, the third metal lines 20 are formed on a layer above the universal electrodes 13 extending in the longitudinal direction. In the lower peripheral area 9, the switchover circuit (COMSW) 62 is provided along the x direction. The switchover circuit 62 is formed in a position close to the display area on a layer above the signal selection circuit (ASW) 54. The switchover circuit 62 is formed on a layer above the first connection lines 212 between the signal selection circuit 54 and the groove 208.

As illustrated in FIG. 19, the switchover circuit 62 includes common feeder line 56 that supplies a DC common voltage COM, a first sensor feeder line 58L that supplies a low level electric potential TPL for a detection signal, a second sensor feeder line 58H that supplies a high level electric potential TPH for the detection signal, and the changeover switches 60 that perform switching between these lines. Each of the changeover switches 60 is provided for each of the universal electrodes 13 and each of the changeover switches 60 is used to determine whether to supply the DC common voltage from the common feeder line 56 or high frequency pulses from the sensor feeder line 58H or 58L to the universal electrode 13.

The universal electrodes 13 and the third metal lines 20 from the display area are laminated as two upper and lower layers and connected to the switchover circuit 62. As illustrated in FIG. 16, the switchover circuit 62 and the signal line driver 52 are connected to each other via control connection lines 220. The control connection lines 220 are connected to the changeover switches 60. The control connection lines 220 are formed on the same layer as the signal lines 15 or the gate lines 16 and are made of the same material as the signal lines 15 or the gate lines 16.

In the embodiment, the shield layer 218 is formed on the first connection lines 212 so as not to cover the switchover circuit 62 and output wires from the switchover circuit 62, as illustrated in FIG. 16.

Figure 17:
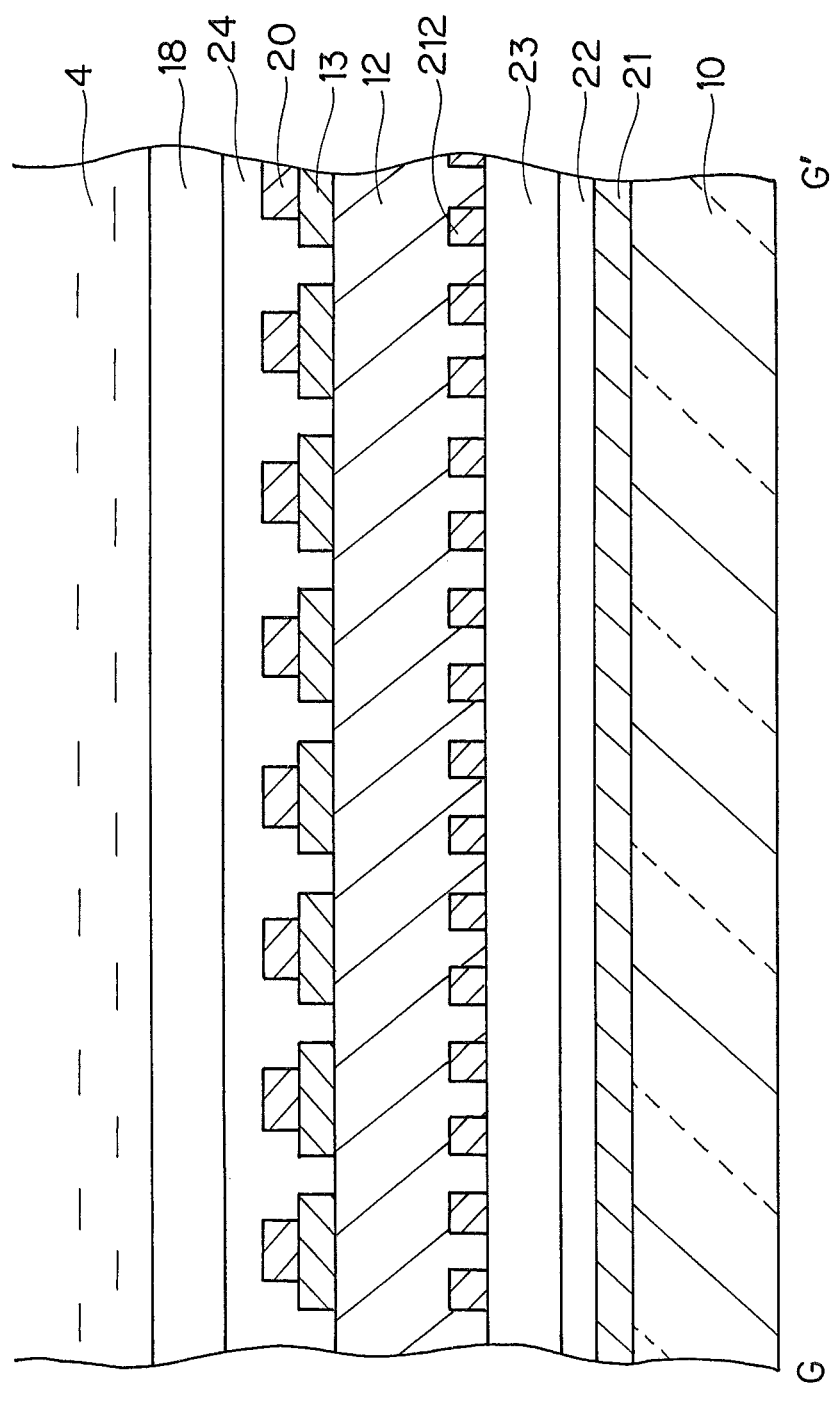
FIG. 17 is a cross sectional view taken along line G-G' in FIG. 16.
Figure 18:
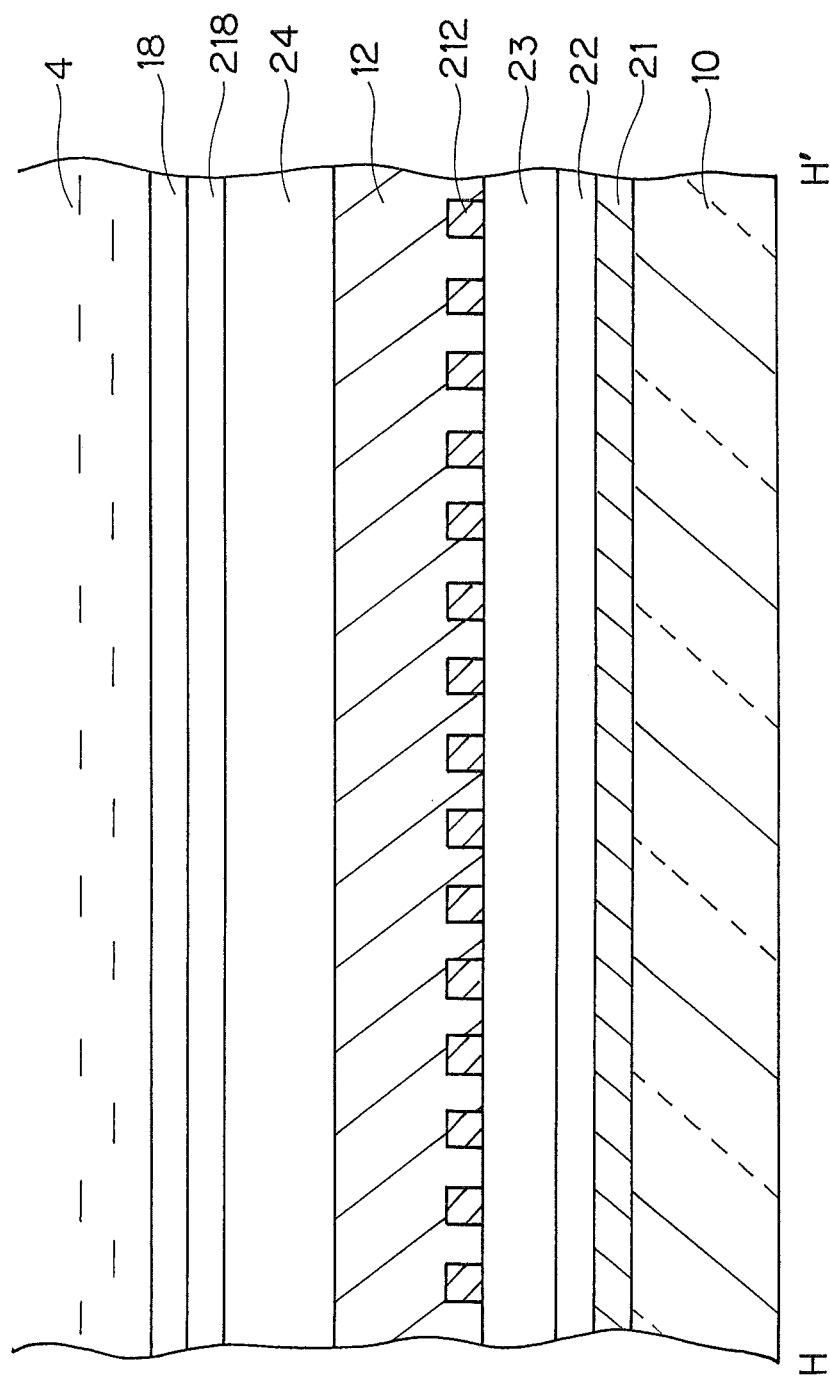
FIG. 18 is a cross sectional view taken along line H-H' in FIG. 16.

FIG. 17 is a cross sectional view illustrating area G-G' in FIG. 16 and FIG. 18 is a cross sectional view illustrating area H-H' in FIG. 16.

As illustrated in FIG. 17, output wires from the switchover circuit 62 are formed on the same layer as the universal electrodes 13 and the third metal lines 20. These wires are formed between the organic insulation film 12 and the second insulation film 24. Normally, the organic insulation film 12 has a thickness of approximately 3000 nm and the second insulation film 24 formed by an inorganic film has a thickness of approximately 120 nm. In addition, the shield layer 218 made of ITO is formed between the second insulation film 24 and the alignment film 18 as illustrated in FIG. 18. Accordingly, if the shield layer 218 is formed on output wires of the switchover circuit 62, the distance between the shield layer 218 and the output wires (the universal electrodes 13 and the third metal lines 20) of the switchover circuit 62 is 120 nm or less and very close to each other. This generates a strong electric field between the shield layer 218 and the output wires (the universal electrodes 13 and the third metal lines 20) of the switchover circuit 62, possibly causing electric corrosion of the output wires (the universal electrodes 13 and the third metal lines 20) of the switchover circuit 62.

Accordingly, in a display panel in which the Tx electrode for a touch panel extends in the longitudinal direction as in the embodiment, the shield layer 218 is disposed around the output wires (the universal electrodes 13 and the third metal lines 20) of the switchover circuit 62.

Since the output wires of the switchover circuit 62 are made of the same material as the universal electrodes 13 and the third metal lines 20 in the embodiment as described above, the output wires of the switchover circuit 62 provide shielding effects and the other area is provided with shielding effects because the area is covered with the shield layer 218.

All embodiments that can be practiced by those skilled in the art by changing the design appropriately based on embodiments of the invention without departing from the spirit of the invention are also included in the scope of the invention.

It will be appreciated that various modifications and corrections that can be reached by those skilled in the art within the concept of the invention are also included in the scope of the invention. For example, embodiments obtained by adding a component to, deleting a component from, or modifying the designs of the above embodiments by those skilled in the art or embodiments obtained by adding a process to, omitting a process from, or changing conditions of the above embodiments by those skilled in the art are also included in the scope of the invention as long as the spirit of the invention is provided.

In addition, other working effects, obtained by processing described in the embodiments, that are apparent from the description in this specification or that can be often reached by those skilled in the art are of course thought to be provided by the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device comprising:
    an array substrate including
        a plurality of pixels in a display area,
        a plurality of signal lines arrayed in a first direction in the display area,
        a signal selection circuit in a peripheral area surrounding the display area,
        a signal line driver in the peripheral area,
        a plurality of connection lines arrayed in the first direction in the peripheral area, and
        a shielding layer overlaps the plurality of connection lines;
    wherein
    the plurality of signal lines are electrically connected to the signal selection circuit,
    the plurality of connection lines are pulled from the signal selection circuit, and are connected to the signal line driver,
    an array pattern of the plurality of connection lines is fan-shaped or trapezoidal in plan view,
    a forming area is an area where the plurality of connection lines are formed, and
    the shielding layer substantially covers an entirety of the forming area.

2. The liquid crystal display device of claim 1, wherein
the array substrate further includes a glass substrate, an organic insulation film, and an alignment film,
the plurality of connection lines are between the glass substrate and the organic insulation film,
the organic insulation film has a first surface and a second surface opposed to the first surface,
the first surface covers the plurality of connection lines, and
the shielding layer is between the second surface and the alignment film.

3. The liquid crystal display device of claim 2, wherein
the organic insulation film includes a groove extending in the first direction,
the groove intersects with the plurality of connection lines,
the shielding layer does not overlap the groove, and
the shielding layer is between the groove and the signal selection circuit.

4. The liquid crystal display device of claim 1, wherein
each of the plurality of the connection lines includes a first connection line and a second connection line,
an insulation film is between the first connection line and the second connection line,
the first connection line is pulled from the signal line driver and is connected to the second connection line via a contact hole in the insulation layer,
the first connection line is connected between the second connection line and the signal selection circuit,
the array pattern of the plurality of connection lines correspond to an array pattern of the plurality of the first connection lines, and
the forming area is an area where the second connection lines are formed.

5. The liquid crystal display device of claim 2, wherein
each of the plurality of the connection lines includes a first connection line and a second connection line,
an insulation film is between the first connection line and the second connection line,
the first connection line is pulled from the signal line driver and is connected to the second connection line via a contact hole in the insulation layer,
the first connection line is connected between the second connection line and the signal selection circuit,
the array pattern of the plurality of connection lines correspond to an array pattern of the plurality of the first connection lines, and is fan-shaped or trapezoidal in plan view, and
the forming area is an area where the second connection lines are formed.

6. The liquid crystal display device of claim 5, wherein
the array substrate further has an inorganic insulation film between the organic insulation film and the alignment film,
the shielding layer is between the inorganic insulation film and the alignment film,
the shielding layer is formed by transparent conductive material, and
the shielding layer is in contact with the alignment film.

* * * * *